United States Patent
Jang et al.

(10) Patent No.: US 6,752,897 B2
(45) Date of Patent: Jun. 22, 2004

(54) WET ETCH SYSTEM WITH OVERFLOW PARTICLE REMOVING FEATURE

(75) Inventors: Ruei-Hung Jang, Shinjuang (TW);
Chih-Lin Ying, Yunghe (TW);
Tien-Hsing Woo, Taipei (TW);
Tsung-Chi Hsieh, Taipei (TW);
Shih-Shiung Chen, Hsin-chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/278,969

(22) Filed: Oct. 22, 2002

(65) Prior Publication Data

US 2004/0074600 A1 Apr. 22, 2004

(51) Int. Cl.[7] .................................................. C23F 1/02
(52) U.S. Cl. .................................. 156/345.11; 134/113
(58) Field of Search ........................ 156/345.11, 345.17, 156/345.18; 134/113

(56) References Cited

U.S. PATENT DOCUMENTS

| | | | | |
|---|---|---|---|---|
| 4,350,553 A | * | 9/1982 | Mendes | .................. 156/345.15 |
| 5,069,235 A | * | 12/1991 | Vetter et al. | ................. 134/113 |
| 5,089,084 A | * | 2/1992 | Chhabra et al. | ............. 438/706 |
| 5,779,927 A | * | 7/1998 | Lo | ............................... 216/84 |
| 6,131,588 A | * | 10/2000 | Kamikawa et al. | ...... 134/102.3 |
| 6,228,211 B1 | * | 5/2001 | Jeong | .................... 156/345.11 |
| 6,513,542 B1 | * | 2/2003 | Hsieh | ........................ 137/312 |

\* cited by examiner

*Primary Examiner*—Gregory Mills
*Assistant Examiner*—Sylvia R. MacArthur
(74) *Attorney, Agent, or Firm*—Tung & Associates

(57) ABSTRACT

A wet etch system including a process tank having an inner etch bath chamber and an outer overflow chamber surrounding the etch bath chamber. A frame which is removably mounted on the process tank defines a diversion channel between the upper ends of the etch bath chamber and overflow chamber. The etch bath chamber receives a wafer-containing cassette, which displaces etchant from the etch bath chamber, through the diversion channel and into the overflow chamber, where the etchant is drained from the process tank. Particulate impurities leave the etch bath chamber, enter the overflow chamber and drain from the process tank with the overflow etchant. Fresh etchant is poured into the etch bath chamber prior to a subsequent etch cycle. A water spray loop may be provided in the overflow chamber for removing etch particles from the interior wall surfaces of the overflow chamber.

20 Claims, 3 Drawing Sheets

WET ETCH SYSTEM WITH OVERFLOW PARTICLE REMOVING FEATURE

FIELD OF THE INVENTION

The present invention relates to etch baths for etching insulative and conductive layers on a semiconductor wafer substrate in the fabrication of integrated circuits on the substrate. More particularly, the present invention relates to a wet etch system which utilizes an overflow of etchant from the bath before each etching cycle in order to remove potential device-contaminating particulate precipitates from an etch bath.

BACKGROUND OF THE INVENTION

Generally, the process for manufacturing integrated circuits on a silicon wafer substrate typically involves deposition of a thin dielectric or conductive film on the wafer using oxidation or any of a variety of chemical vapor deposition processes; formation of a circuit pattern on a layer of photoresist material by photolithography; placing a photoresist mask layer corresponding to the circuit pattern on the wafer; etching of the circuit pattern in the conductive layer on the wafer; and stripping of the photoresist mask layer from the wafer. These steps are carried out in highly-specialized, automated equipment. Many of the steps used in the IC fabrication process, particularly the etching and photoresist stripping steps, provide abundant opportunity for potential circuit-contaminating particles to form and contaminate the devices being fabricated on the wafer.

In the semiconductor fabrication industry, minimization of particle contamination on semiconductor wafers increases in importance as the integrated circuit devices on the wafers decrease in size. With the reduced size of the devices, a contaminant having a particular size occupies a relatively larger percentage of the available space for circuit elements on the wafer as compared to wafers containing the larger devices of the past. Moreover, the presence of particles in the integrated circuits compromises the functional integrity of the devices in the finished electronic product. Currently, mini-environment based IC manufacturing facilities are equipped to control airborne particles much smaller than 1.0 $\mu$m, as surface contamination continues to be of high priority to semiconductor manufacturers. To achieve an ultra clean wafer surface, particles must be removed from the wafer, and particle-removing methods are therefore of utmost importance in the fabrication of semiconductors.

The most common system for cleaning semiconductor wafers during wafer processing includes a series of tanks which contain the necessary cleaning solutions and are positioned in a "wet bench" in a clean room. Batches of wafers are moved in sequence through the tanks, typically by operation of a computer-controlled automated apparatus. Currently, semiconductor manufacturers use wet cleaning processes which may use cleaning agents such as deionized water and/or surfactants. Other wafer-cleaning processes utilize solvents, dry cleaning using high-velocity gas jets, and a megasonic cleaning process, in which very high-frequency sound waves are used to dislodge particles from the wafer surface. Cleaning systems which use deionized (DI) water currently are widely used in the industry because the systems are effective in removing particles from the wafers and are relatively cost-efficient. Approximately 4.5 tons of water are used for the production of each 200-mm, 16-Mbit, DRAM wafer.

Etching processes are used to form the geometric circuit patterns in the layers and to form vias for electrical contact between the layers. Etching processes include "wet" etching, in which one or more chemical reagents are brought into direct contact with the substrate, and "dry" etching, such as reactive ion (RI) etching, reactive ion beam etching and plasma etching. In plasma etching processes, a gas is first introduced into a reaction chamber and then plasma is generated from the gas. This is accomplished by dissociation of the gas into ions, free radicals and electrons by using an RF (radio frequency) generator, which includes one or more electrodes. The electrodes are accelerated in an electric field generated by the electrodes, and the energized electrons strike gas molecules to form additional ions, free radicals and electrons, which strike additional gas molecules, and the plasma eventually becomes self-sustaining. The ions, free radicals and electrons in the plasma react chemically with the layer material on the semiconductor wafer to form residual products which leave the wafer surface and thus, etch the material from the wafer.

The plasma generated in a plasma etching process includes high-energy ions, free radicals and electrons which react chemically with the surface material of the semiconductor wafer to form reaction produces that leave the wafer surface, thereby etching a geometrical pattern or a via in a wafer layer. Plasma intensity depends on the type of etchant gas or gases used, as well as the etchant gas pressure and temperature and the radio frequency generated at an electrode in the process chamber by an RF generator. If any of these factors changes during the process, the plasma intensity may increase or decrease with respect to the plasma intensity level required for optimum etching in a particular application. Decreased plasma intensity results in decreased, and thus incomplete, etching. Increased plasma intensity, on the other hand, can cause overetching and plasma-induced damage of the wafers. Plasma-induced damage includes trapped interface charges, material defects migration into bulk materials, and contamination caused by the deposition of etch products on material surfaces. Etch damage induced by reactive plasma can alter the qualities of sensitive IC components such as Schottky diodes, the rectifying capability of which can be reduced considerably. Heavy-polymer deposition during oxide contact hole etching may cause high-contact resistance.

Furthermore, plasma-etching techniques are incapable of discriminating between the layer or layers to be etched and the underlying layer or layers, which should remain unaffected by the etching process. For these reasons, the plasma reactor must be equipped with a monitor that indicates when the etching process is to be stopped. Such a monitor may utilize an end-point system or mode to terminate etching in order to prevent undesired etching of the underlying layer on the wafer.

Dry etching methods, particularly plasma etching, have become the most widely-used methods for etching wafers in advanced IC wafer fabrication. Materials such as silicon and aluminum are nearly always dry etched for submicron fabrication. However, in some cases, wet etching processes are capable of providing high etch selectivity that cannot be attained using dry etching. Moreover, wet etching eliminates plasma damage. A wet etching process which utilizes hot phosphoric acid ($H_3PO_4$) is frequently used to remove masking layers made of silicon nitride ($Si_3N_4$). The wet etching process is typically carried out by immersing successive batches of wafers in the heated liquid etchant phosphoric acid, which is contained in a bath container.

During the wet etching process, the etchant phosphoric acid reacts with the silicon nitride to form silicon dioxide as a byproduct. A common drawback of conventional wet etching systems is that the silicon nitride precipitate tends to accumulate in the bath container and contaminate devices being formed on the wafer. Many conventional wet etching systems include a filter loop having a filter pump which removes the particulate contaminants from the etchant, after which the filtered etchant is returned to the etch bath. However, over time the filter gradually becomes clogged and less efficient in the removal of the particles from the etchant in the etch bath. Accordingly, a new and improved etch bath is needed for the efficient and frequent removal of particulate contaminants from an etch bath between etch cycles.

An object of the present invention is to provide a new and improved wet etch system for preventing particle contamination of devices being formed on a wafer substrate during a wet etching process.

Another object of the present invention is to provide a new and improved wet etch system which removes potential device-contaminating particles from an etch bath between wet etching cycles.

Still another object of the present invention is to provide a wet etch system which utilizes a regular overflow of used etchant from an etch bath to remove potential device-contaminating particles from the bath prior to each subsequent wet etch cycle.

Yet another object of the present invention is to provide a wet etch system which includes a process tank having an inner etch bath chamber and an outer overflow chamber surrounding the inner etch bath chamber for receiving overflow of etchant from the inner etch bath chamber upon placement of a wafer-containing cassette in the etch bath container for a subsequent cycle of wet etching.

A still further object of the present invention is to provide a wet etch system including a process tank which is divided into an inner etch bath chamber, an outer overflow chamber for receiving an overflow of etchant from the etch bath chamber upon placement of a wafer-containing cassette in the etch bath chamber, and a water spray loop provided in the overflow chamber for rinsing overflow etchant down the walls of the overflow chamber.

SUMMARY OF THE INVENTION

The present invention is generally directed to a wet etch system which includes a process tank having an inner etch bath chamber for containing a liquid etchant and an outer overflow chamber surrounding the etch bath chamber. A frame which is typically removably mounted on the process tank defines a diversion channel between the upper ends of the etch bath chamber and overflow chamber. In operation, the etch bath chamber receives a wafer-containing cassette, which displaces etchant from the etch bath chamber, through the diversion channel and into the overflow chamber, where the etchant is drained from the process tank through drain openings in the bottom of the overflow chamber. Particulate impurities which formed in the etch bath chamber during previous wet etching cycles leave the etch bath chamber, enter the overflow chamber and are drained from the process tank with the overflow etchant. Finally, fresh etchant is poured into the etch bath chamber prior to a subsequent etch cycle. A water spray loop may be provided in the overflow chamber for spraying and removing used etchant and etch particles from the interior wall surfaces of the overflow chamber during or after each etch cycle.

BRIEF DESCRIPTION OF THE DRAWINGS

The invention will now be described, by way of example, with reference to the accompanying drawings, in which.

DESCRIPTION OF THE PREFERRED EMBODIMENTS

The present invention has particularly beneficial utility in the removal of particulate impurities from a liquid etchant used in the wet etching of material layers from semiconductor wafer substrates during the fabrication of integrated circuits on the substrates. However, the invention is not so limited in application, and while references may be made to such wet etching of semiconductor wafers, the present invention may be applicable to facilitating removal of particulate impurities from liquids in a variety of industrial and mechanical applications.

Figure 1:
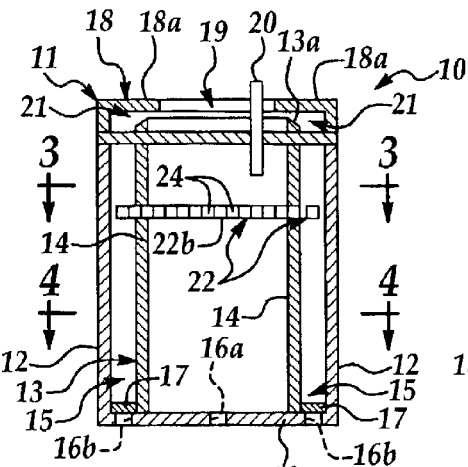
FIG. 1 is a transverse sectional view of an illustrative embodiment of the wet etch system of the present invention.
Figure 2:
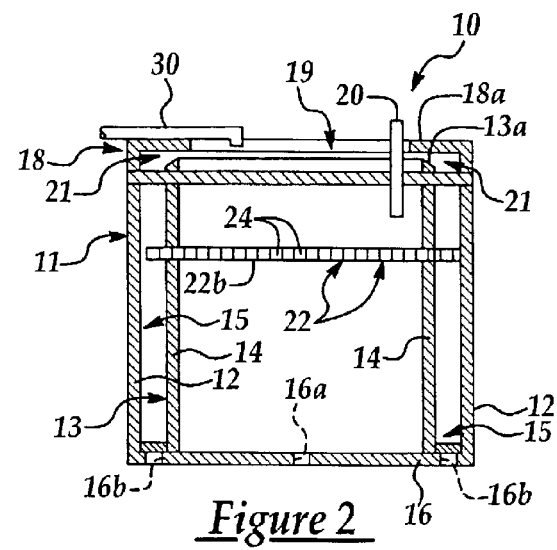
FIG. 2 is a longitudinal sectional view of an illustrative embodiment of the wet etch system of the present invention.
Figure 3:
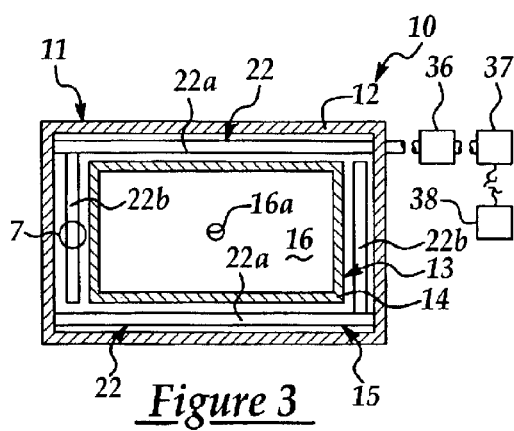
FIG. 3 is a cross-sectional view of the wet etch system, taken along section lines 3—3 in FIG. 1.
Figure 4:
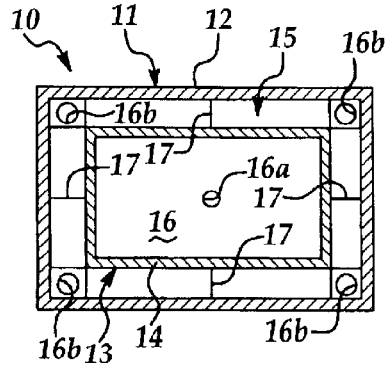
FIG. 4 is a cross-sectional view of the wet etch system, taken along section lines 4—4 in FIG. 1.
Figure 5:
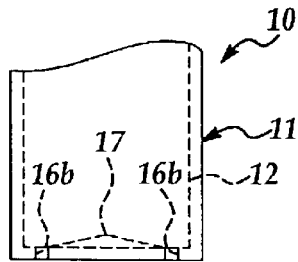
FIG. 5 is a front view of the wet etch system, more particularly illustrating a drain wedge (in phantom) provided at the bottom of the overflow chamber of the process tank to facilitate expedited and smooth drainage of used etchant and etch particles from the overflow chamber.
Figure 6:
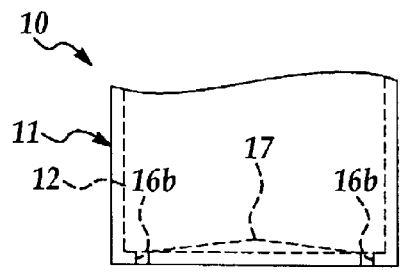
FIG. 6 is a side view of the wet etch system, more particularly illustrating a drain wedge (in phantom) provided at the bottom of the overflow chamber of the process tank to facilitate expedited and smooth drainage of used etchant and etch particles from the overflow chamber.

An illustrative embodiment of the wet etch system of the present invention is generally indicated by reference numeral 10 in FIGS. 1–4, in cross-section, and includes a typically rectangular process tank 11 having a process tank wall 12 that is closed by a tank bottom 16. A bath chamber wall 14 inside the process tank wall 12 defines an inner etch bath chamber 13 in the process tank 11. The bath chamber wall 14 may be constructed of polytetrafluoroethylene (TEFLON®). Alternatively, the interior surface of the bath chamber wall 14 may be coated with polytetrafluoroethylene (TEFLON®). One or more etch chamber drain openings 16a may extend through the tank bottom 16, inside the etch bath chamber 13, typically for purposes of maintaining the etch bath chamber 13. An outer, overflow chamber 15 is defined between the process tank wall 12 and the bath chamber wall 14, and surrounds the etch bath chamber 13 as shown in FIGS. 3 and 4. A continuous bevel 13a is formed in the upper edge of the bath chamber wall 14 and angles downwardly toward the process tank wall 12. As shown in FIG. 4, an overflow chamber drain opening 16b extends through the tank bottom 16 at each corner of the overflow chamber 15. A sloped drain wedge 17 extends between adjacent overflow chamber openings 16b, for purposes which will be hereinafter described.

Figure 7:
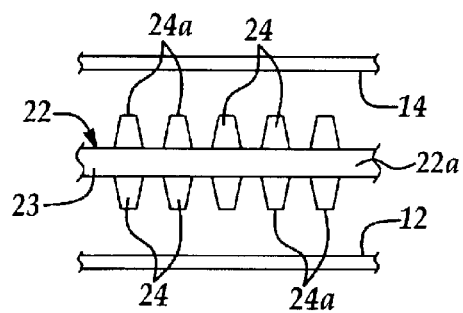
FIG. 7 is a top view, taken along section line 7 in FIG. 3, of a water spray loop element of a wet etch system of the present invention.

A frame 18, having a central frame opening 19, is typically removably mounted on the process tank wall 12. A level sensor 20 is mounted on the frame 18 and extends downwardly into the etch bath chamber 13, as shown in FIGS. 1 and 2. As shown in FIG. 2, the frame 18 may additionally support etchant supply piping 30 for the introduction of fresh etchant 29 (FIG. 8C) into the etch bath chamber 13, as hereinafter described. The frame 18 includes inwardly-extending frame ears 18a which extend generally horizontally over the bevels 13a in the upper edge of the process tank wall 12. A diversion channel 21 is defined between the frame ears 18 and the bath chamber wall 14. A pair of water spray loops 22 is provided in the overflow chamber 15, and each includes a longitudinal arm 22a which traverses the longitudinal dimension of the process tank wall 12 and a transverse arm 22b which extends substantially perpendicularly from each longitudinal arm 22a. As shown in FIG. 7, each longitudinal arm 22a and transverse arm 22b of each water spray loop 22 includes a water conduit 23. As shown in FIG. 3, the conduit 23 of the longitudinal arm 22a is confluently connected to a deionized water pump and supply 37, through a water flow meter 36. Multiple, adjacent spray nozzles 24 extend from opposite sides of the water conduit 23 of both the longitudinal arm 22a and the transverse arm 22b, toward the interior surfaces of the process tank wall 12 and the bath chamber wall 14, respectively. Each spray nozzle 24 has a nozzle opening 24a which may have a diameter of about 1 mm. It is understood that the pair of water spray loops 22 may alternatively define a single water spray loop 22 and may have any alternative configuration suitable for spraying the interior surfaces of the process tank wall 12 and the bath chamber wall 14, respectively, in flush cycles as hereinafter described. As further shown in FIG. 3, a timer 38 may be operably connected to the water pump and supply 37 for controlling the duration of the flush cycles imparted by the water spray loop or loops 22.

Referring next to FIGS. 8A–10, in operation of the wet etch system 10, the etch bath chamber 13 is filled with a supply of liquid etchant 27 to a desired etchant level 28. After previous processing of a wafer (not shown) in the etchant 27, in a step preceding the step shown in FIG. 8A, multiple particulate impurities 26 are typically suspended in the etchant 27. The particulate impurities 26 may be formed in the etchant 27 as hot phosphoric acid ($H_3PO_4$) etchant 27 reacts with silicon nitride ($Si_3N_4$), such as during the removal of mask material from the wafer, to form the silicon dioxide impurities 26, for example. The particulate impurities 26 must be removed from the etch bath chamber 13 prior to processing of a subsequent batch of wafers in the wet etch system 10. Accordingly, as shown in FIG. 8B, a wafer holder 32, which typically contains multiple wafers 31, is placed in the bottom of the etch bath chamber 13 for etching of the wafers 31. As it is placed in the etch bath chamber 13, the wafer holder 32 displaces a volume of etchant 27 which equals the volume of the wafer holder 32. This causes the etchant 27 to overflow from the etch bath chamber 13, through the diversion channel 21 and into the overflow chamber 15, as shown in FIG. 8B. The sloped bevel 13a in the upper end of the etch bath chamber 13 facilitates smooth flow of the etchant 27, with all or most of the particulate impurities 26, through the diversion channel 21 and into the overflow chamber 15. Accordingly, the etchant 27 is drained from the overflow chamber 15 and leaves the process tank 11 through the four overflow chamber drain openings 16b at the respective corners of the overflow chamber 15.

Figure 8A:
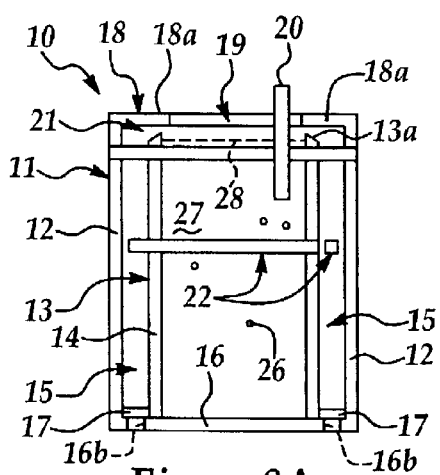
FIG. 8A is a schematic view of a wet etch system of the present invention, preparatory to an etch cycle in implementation of the present invention.
Figure 8B:
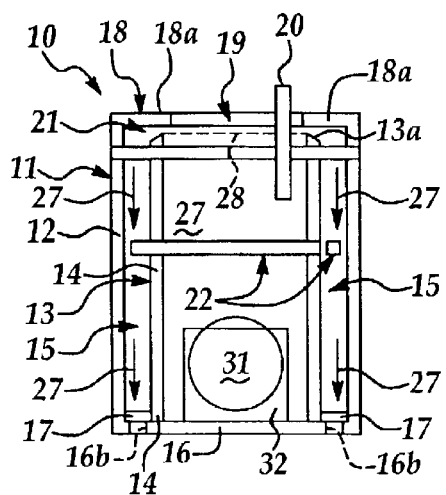
FIG. 8B is a schematic view of a wet etch system of the present invention, during an etch cycle in implementation of the present invention.
Figure 9:
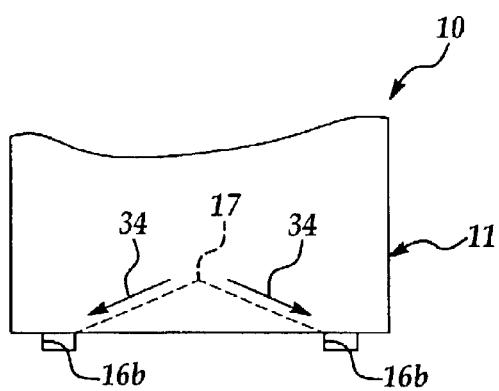
FIG. 9 is a front view of the wet etch system of the present invention, illustrating enhanced drainage of water from the overflow chamber of the system due to the presence of a drain wedge in the bottom of the overflow chamber.
Figure 10:
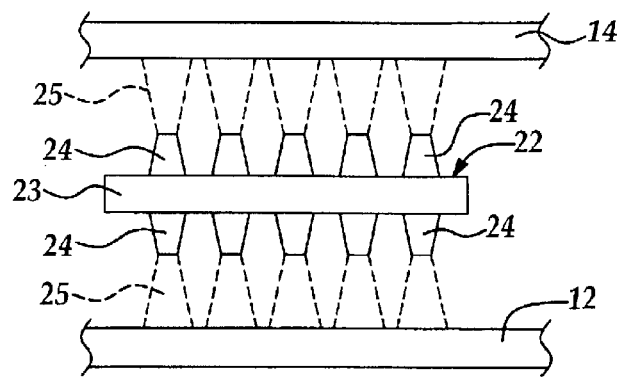
FIG. 10 is a top view of a water spray loop element of the present invention, more particularly illustrating rinsing of the interior walls of the overflow chamber to remove used etchant and etch particles from the overflow chamber during or after an etch cycle.

After it flows from the etch bath chamber 13 down the sloped surface presented by the bevel 13a, much of the etchant 27 flows downwardly through the overflow chamber 15 under influence of gravity while adhering to the interior surfaces of the process tank wall 12 and the bath chamber wall 14. Simultaneously, as shown in FIG. 10, a DI water spray 25 is ejected from each of the spray nozzles 24 on the water spray loops 22, against the interior surfaces of the process tank wall 12 and the bath chamber wall 14. This tends to wash the effluent etchant and particulate impurities therein down the surfaces of the process tank wall 12 and bath chamber wall 14, to the bottom of the overflow chamber 15. The duration of the water sprays 25 for each wash cycle is typically controlled by the timer 38 (FIG. 3), through the water supply 37. The water flow meter 36 (FIG. 3) controls the rate of flow of the DI water from the water spray loop or loops 22. As shown in FIG. 9, the drain wedges 17 which extend between adjacent overflow chamber drain openings 16b at the bottom of the overflow chamber 15 facilitate runoff of etchant and water effluent 34 into the overflow chamber drain openings 16b. Consequently, the concentration of particulate impurities 26 in the etchant 27 are subsequently reduced prior to etching of the wafers 31 as shown in FIG. 8B. Because the wafer holder 32 typically has a fixed volume, the quantity of etchant 27 which overflows from the etch bath chamber 13 at the step shown in FIG. 8B may be controlled by adjusting the etchant level 28 in the etch bath chamber 13 at the step shown in FIG. 8A, prior to placement of the wafer holder 32 in the etchant 27.

Figure 8C:
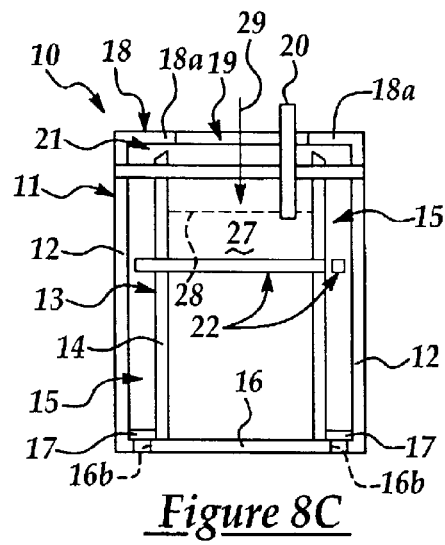
FIG. 8C is a schematic view of a wet etch system of the present invention, after an etch cycle, more particularly illustrating placement of fresh etchant into the etch bath chamber of the process tank preparatory to a subsequent etch cycle.

After etching of the wafers 31 is completed, the wafer holder 32 is removed from the etch bath chamber 13, causing the etchant level 28 to fall in the etch bath chamber 13, as shown in FIG. 8C. Therefore, fresh etchant 29 is poured into the etch bath chamber 13, typically from the etchant supply piping 30 (FIG. 2) through the frame opening 19, until the etchant 27 rises to the desired etchant level 28 in the etch bath chamber 13, as shown in FIG. 8A. Accordingly, a second wafer holder filled with wafers may be placed in the etch bath chamber 13 for processing of the wafers therein, as heretofore described with respect to FIGS. 8B and 8C. It will be appreciated by those skilled in the art that the etching or strip rate of the etchant 27 does not decrease since the concentration of etchant 27 is maintained at a constant value from one etch cycle to another. Furthermore, removal of a volume of the etchant 27 from the etch bath chamber 13 by overflow before significant cooling of the etchant 27 prevents formation of additional impurities which may otherwise contaminate the etch bath chamber 13.

While the preferred embodiments of the invention have been described above, it will be recognized and understood that various modifications can be made in the invention and the appended claims are intended to cover all such modifications which may fall within the spirit and scope of the invention.

What is claimed is:

1. A wet etch system for removing particles from an etchant liquid in the etching of wafers, comprising:
   a process tank having an etch bath chamber for receiving the etchant liquid and the wafers;
   an overflow chamber provided in substantially surrounding relationship to said etch bath chamber for receiving an overflow quantity of the etchant liquid and at least a quantity of the particles from said etch bath chamber upon placement of the wafers in said etch bath chamber; and
   a generally horizontal diversion channel defined between said process tank and said overflow chamber.

2. The wet etch system of claim 1 further comprising a bath frame provided on said process tank and having a central frame opening disposed above said etch bath chamber.

3. The wet etch system of claim 2 wherein said bath frame is removably mounted on said process tank.

4. The wet etch system of claim 1 further comprising a plurality of overflow chamber drain openings provided in said overflow chamber for draining the overflow quantity of the etchant liquid from said overflow chamber.

5. A wet etch system for removing particles from an etchant liquid in the etching of wafers, comprising:
   a process tank having an etch bath chamber for receiving the etchant liquid and the wafers;
   an overflow chamber provided in substantially surrounding relationship to said etch bath chamber for receiving an overflow quantity of the etchant liquid and at least a quantity of the particles from said etch bath chamber upon placement of the wafers in said etch bath chamber;
   a plurality of overflow chamber drain openings provided in said overflow chamber for draining the overflow quantity of the etchant liquid from said overflow chamber; and
   a drain wedge extending between adjacent ones of said plurality of overflow chamber drain openings for directing the etchant liquid into said adjacent ones of said plurality of overflow chamber drain openings.

6. A wet etch system for removing particles from an etchant liquid in the etching of wafers, comprising:
   a process tank having an etch bath chamber for receiving the etchant liquid and the wafers;
   an overflow chamber provided in substantially surrounding relationship to said etch bath chamber for receiving an overflow quantity of the etchant liquid and at least a quantity of the particles from said etch bath chamber upon placement of the wafers in said etch bath chamber; and
   at least one water spray loop provided in said overflow chamber for rinsing said overflow chamber with water.

7. The wet etch system of claim 6 further comprising a level sensor extending into said etch bath chamber for sensing a level of the etchant in said etch bath chamber.

8. The wet etch system of claim 6 wherein said at least one water spray loop comprises a water conduit and a plurality of spray nozzles having a plurality of nozzle openings, respectively, extending from said water conduit.

9. The wet etch system of claim 8 wherein said plurality of nozzle openings each has a width of about 1 mm.

10. The wet etch system of claim 6 further comprising a timer operably connected to said at least one water spray loop for controlling duration of water sprayed from said at least one water spray loop.

11. The wet etch system of claim 6 further comprising a water flow meter operably connected to said at least one water spray loop for controlling a rate of flow of water sprayed from said at least one water spray loop.

12. The wet etch system of claim 1 wherein said etch bath chamber comprises inner surfaces of polytetrafluoroethylene.

13. The wet etch system of claim 1 further comprising a sloped bevel provided in an upper edge of said etch bath chamber for enhancing flow of the overflow quantity of the etchant liquid from said etch bath chamber to said overflow chamber.

14. A wet etch system for removing particles from an etchant liquid in the etching of wafers, comprising:
   a process tank having an etch bath chamber for receiving the etchant liquid and the wafers;
   an overflow chamber provided in substantially surrounding relationship to said etch bath chamber for receiving an overflow quantity of the etchant liquid and at least a quantity of the particles from said etch bath chamber upon placement of the wafers in said etch bath chamber;
   a bath frame carried by said process tank, said bath frame comprising frame ears; and
   a diversion channel defined between said frame ears and said etch bath chamber for conducting the overflow quantity of the etchant liquid from said etch bath chamber to said overflow chamber.

15. The wet etch system of claim 14 further comprising a level sensor carried by said frame for sensing a level of the etchant liquid in said etch bath chamber.

16. The wet etch system of claim 14 further comprising a plurality of overflow chamber drain openings provided in said overflow chamber for draining the overflow quantity of the etchant liquid from said overflow chamber and further comprising a drain wedge extending between adjacent ones of said plurality of overflow chamber drain openings for directing the etchant liquid into said plurality of overflow chamber drain openings.

17. The wet etch system of claim 14 further comprising at least one water spray loop provided in said overflow chamber for rinsing said overflow chamber with water.

18. The wet etch system of claim 14 further comprising a level sensor extending into said etch bath chamber for sensing a level of the etchant liquid in said etch bath chamber.

19. A wet etch system for removing particles from an etchant liquid in the etching of wafers, comprising:
   a process tank having an etch bath chamber for receiving the etchant liquid and the wafers;
   an overflow chamber provided in substantially surrounding relationship to said etch bath chamber for receiving an overflow quantity of the etchant liquid and at least a quantity of the particles from said etch bath chamber upon placement of the wafers in said etch bath chamber;
   a sloped bevel provided in an upper edge of said etch bath chamber for enhancing flow of the overflow quantity of the etchant liquid from said etch bath chamber to said overflow chamber;
   a bath frame removably carried by said process tank, said bath frame comprising frame ears; and
   a diversion channel defined between said frame ears and said etch bath chamber for conducting the overflow quantity of the etchant liquid from said etch bath chamber to said overflow chamber.

20. The wet etch system of claim 19 wherein said etch bath chamber comprises inner surfaces of polytetrafluoroethylene.

* * * * *